(12) United States Patent
Park et al.

(10) Patent No.: US 11,769,697 B2
(45) Date of Patent: Sep. 26, 2023

(54) WAFER EVALUATION METHOD

(71) Applicant: SK SILTRON CO., LTD., Gumi-si (KR)

(72) Inventors: Jung Kil Park, Gumi-si (KR); Ja Young Kim, Gumi-si (KR)

(73) Assignee: SK SILTRON CO., LTD., Gyeongsangbuk-Do (KR)

( * ) Notice: Subject to any disclaimer, the term of this patent is extended or adjusted under 35 U.S.C. 154(b) by 282 days.

(21) Appl. No.: 17/436,683

(22) PCT Filed: Jan. 23, 2020

(86) PCT No.: PCT/KR2020/001171
§ 371 (c)(1),
(2) Date: Sep. 7, 2021

(87) PCT Pub. No.: WO2020/180010
PCT Pub. Date: Sep. 10, 2020

(65) Prior Publication Data
US 2022/0148925 A1 May 12, 2022

(30) Foreign Application Priority Data
Mar. 6, 2019 (KR) .................. 10-2019-0025722

(51) Int. Cl.
*H01L 21/66* (2006.01)
*H01L 21/22* (2006.01)
(52) U.S. Cl.
CPC .......... *H01L 22/12* (2013.01); *H01L 21/2205* (2013.01)

(58) Field of Classification Search
CPC ..... H01L 22/12; H01L 22/26; H01L 21/2205; H01L 21/02; H01L 21/76; H01L 21/78; H01L 21/02293; H01L 21/324
See application file for complete search history.

(56) References Cited

U.S. PATENT DOCUMENTS

| 2001/0036434 A1 | 11/2001 | Yamoto et al. |
| 2003/0227057 A1* | 12/2003 | Lochtefeld ............... H01L 21/84 257/E21.127 |
| 2010/0240227 A1* | 9/2010 | Gluschenkov ........ H01L 21/268 257/E21.333 |

FOREIGN PATENT DOCUMENTS

| JP | 2011-155130 | 8/2011 |
| KR | 10-2006-0072694 | 6/2006 |
| KR | 10-2012-0009869 | 2/2012 |
| KR | 10-2017-0091931 | 8/2017 |

OTHER PUBLICATIONS

International Search Report dated May 4, 2020 issued in Application No. PCT/KR2020/001171.

* cited by examiner

*Primary Examiner* — Marc Anthony Armand
(74) *Attorney, Agent, or Firm* — KED & ASSOCIATES, LLP

(57) ABSTRACT

An embodiment provides an epitaxial water evaluation method comprising the steps of: cutting a wafer into a first specimen and a second specimen; growing and thermally treating epitaxial layers of the first and second specimens under different conditions; and measuring the diffusion distance of a dopant in each of the epitaxial layers of the first and second specimens.

7 Claims, 7 Drawing Sheets

WAFER EVALUATION METHOD

CROSS-REFERENCE TO RELATED PATENT APPLICATIONS

This application is a U.S. National Stage Application under 35 U.S.C. § 371 of PCT Application No. PCT/KR2020/001171, filed Jan. 23, 2020, which claims priority to Korean Patent Application No. 10-2019-0025722, filed Mar. 6, 2019, whose entire disclosures are hereby incorporated by reference.

TECHNICAL FIELD

Embodiments relate to a method for evaluating a wafer, and more particularly, to a method for evaluating a wafer that is capable of maintaining a uniform thickness of an epitaxial layer in a process of manufacturing a device such as a semiconductor.

BACKGROUND ART

A silicon wafer used as a material for manufacturing electronic components such as semiconductors or solar cells is manufactured by performing a series of processes after growing a silicon single crystal ingot by a Czochralski (CZ) method or the like. Then, a semiconductor is manufactured through a series of process such as implanting predetermined ions into a wafer and forming a circuit pattern.

A CMOS image sensor (CIS) may be divided into a front-side illuminated image sensor (FSI) and a back-side illuminated image sensor (BSI). In the process of manufacturing a BSI, a carrier wafer is attached onto an epitaxial layer, a portion of a bulk silicon wafer is removed through mechanical grinding, and etching is performed thereon using a wet etching method such that only a portion of the epitaxial layer remains.

In this case, the thickness of the residual epitaxial layer after wet etching needs to be controlled. In addition, boron may diffuse from the bulk silicon wafer into the epitaxial layer before wet etching due to the thermal effect of the BSI process at various temperatures, and the difference in boron concentration may cause the difference in the etching rate during wet etching, which may result in non-uniformity of the film thickness of the residual epitaxial layer.

FIG. 1 shows the relationship between the thickness of the epitaxial layer and the boron concentration.

In FIG. 1, the vertical axis represents the concentration of boron (B), the horizontal axis represents the thickness of the epitaxial layer, etc., and red (As EPI) represents the concentration of boron in each region after the epitaxial layer is grown. The concentration of boron decreases from the substrate to the carrier (BSI carrier) through the epitaxial layer (EPI layer), because there is a limit to the diffusion of boron present in the substrate to the inside.

In FIG. 1, black (in BSI) represents the concentration of boron after heat treatment and it can be seen therefrom that the concentration of boron in each layer after heat treatment is higher than that before heat treatment because, during heat treatment, boron diffuses into the inside, that is, in the carrier direction, and the concentration thereof increases. That is, when heat treatment is performed at a high temperature, silicon (Si) atoms in the oxygen precipitate ($SiO_2$) may escape from the lattice, the concentration of silicon atoms in the gap between the lattices increase, and boron diffuses while the increased silicon atoms between the lattices and boron atoms switch the positions thereof.

Therefore, when the concentration of boron increases, the wet etching process may proceed faster, and thus the thickness of the residual epitaxial layer may be reduced after heat treatment and then grinding and wet etching.

DISCLOSURE

Technical Problem

An embodiment provides a wafer evaluation method that is capable of maintaining a uniform thickness of an epitaxial layer in a process of forming the epitaxial wafer.

Technical Solution

In an embodiment, a method of evaluating a wafer includes cutting a wafer into a first specimen and a second specimen, growing and heat-treating epitaxial layers of the first specimen and the second specimen under different conditions, and measuring a diffusion distance of a dopant in each of the epitaxial layers of the first specimen and the second specimen.

The measurement of the diffusion distance of the dopant may be performed using at least one of secondary ion mass spectrometry (SIMS) and spreading resistance probing (SRP).

A heat treatment time, a growth temperature and a growth time of the epitaxial layer, and an etching time of the wafer of the first specimen may be the same as those of the second specimen, whereas a heat treatment temperature of the first specimen may be higher than that of the second specimen.

The heat treatment temperature of the first specimen may be at most 10° C. higher than the heat treatment temperature of the second specimen.

A heat treatment temperature, a growth temperature and a growth time of the epitaxial layer, and an etching time of the wafer of the first specimen may be the same as those of the second specimen, whereas a heat treatment time of the first specimen may be shorter than that of the second specimen.

The heat treatment time of the first specimen may be at most 30 seconds shorter than that of the second specimen.

A heat treatment temperature, a heat treatment time, and a growth temperature and a growth time of the epitaxial layer of the first specimen may be the same as those of the second specimen, whereas an etching time of the first specimen may be shorter than that of the second specimen.

The etching time of the first specimen may be at most 5 seconds shorter than that of the second specimen.

Advantageous Effects

According to the method for evaluating the epitaxial wafer according to the embodiment, the factors affecting the remaining film thickness of the epitaxial layer in the BSI heat treatment process are the EPI process temperature and time, and etching time. Specifically, as the EPI process temperature increases, the EPI process time decreases, and the etching time decreases, the diffusion of boron is facilitated and the density of boron in the epitaxial layer increases.

BEST MODE

Hereinafter, reference will now be made in detail to the preferred embodiments of the present invention, examples of which are illustrated in the accompanying drawings.

However, the embodiments according to the present invention may be implemented in various other forms, and should not be construed as limiting the scope of the present invention and are provided to more completely explain the present invention to those of ordinary skill in the art.

In addition, relational terms such as "first" and "second", "upper" and "lower" shall not necessarily require or imply any physical or logical relationship or order between such entities or elements, and may be used only to distinguish one entity or element from another entity or element.

Figure 1:
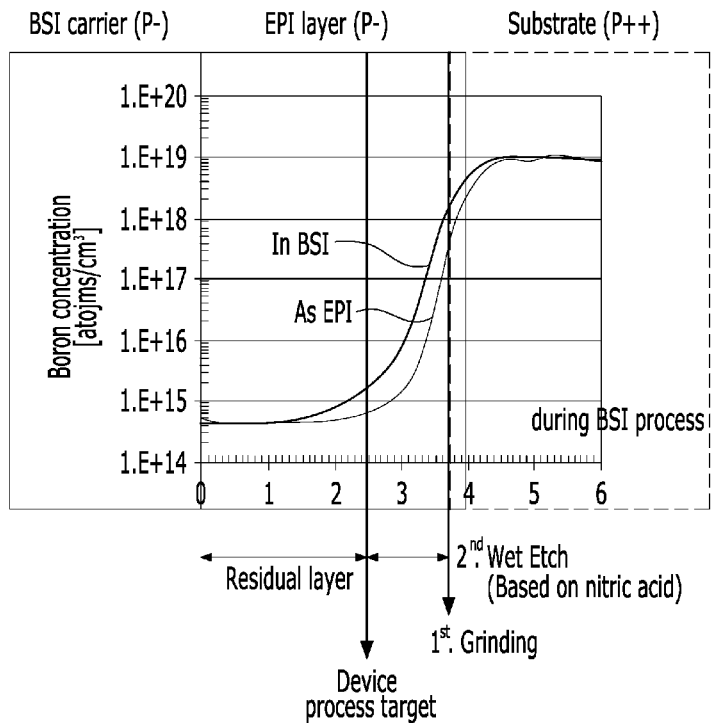
FIG. 1 illustrates the relationship between the thickness of the epitaxial layer and the boron concentration.
Figure 2:
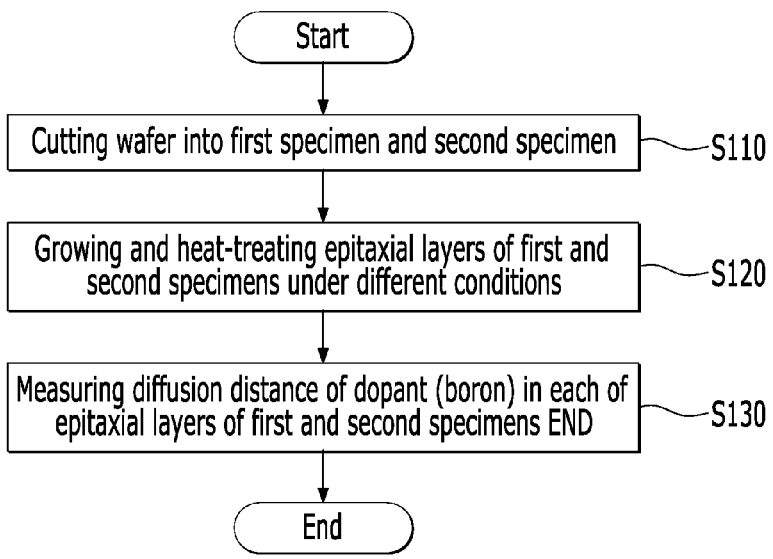
FIG. 2 is a flowchart illustrating an example of a method for evaluating a wafer according to an embodiment.

FIG. 2 is a flowchart illustrating an example of a method for evaluating a wafer according to an embodiment.

In the method for evaluating the wafer according to the embodiment, in order to predict non-uniformity of the thickness of the residual epitaxial layer after heat treatment and etching, a wafer is cut into a first specimen and a second specimen (S110), epitaxial layers of the first and second specimens are grown and heat-treated under different conditions (S120), and a diffusion distance of a dopant (boron) in each of the epitaxial layers of the first specimen and the second specimen is measured (S130).

This will be described in detail.

The silicon wafer used in the method of evaluating the wafer according to the embodiment is prepared by grinding the outer circumferential surface of a grown silicon single crystal ingot by a CZ method, etc., slicing to thinly cut the single crystal silicon ingot in the form of a wafer, lapping to improve flatness of the wafer while polishing the wafer to a desired thickness, etching to remove a damaged layer from the wafer, polishing to improve surface mirror finish and flatness, cleaning to remove contaminants from the wafer surface, forming an oxide film, a rapid thermal process and the like.

First, one wafer may be cut into a first specimen and a second specimen. In this case, the epitaxial layer may be grown and heat-treated on the first specimen and the second specimen under different conditions, but one specimen may be heat-treated and the other specimen may not be heat-treated.

In addition, the diffusion distance of a dopant, for example, boron (B), in each of the epitaxial layers of the first specimen and the second specimen, may be measured. In this case, the measurement of the diffusion distance of the dopant may be performed using at least one of secondary ion mass spectrometry (SIMS), a laser microscope, an atomic force microscope (AFM), and spreading resistance probing (SRP).

Figure 3:
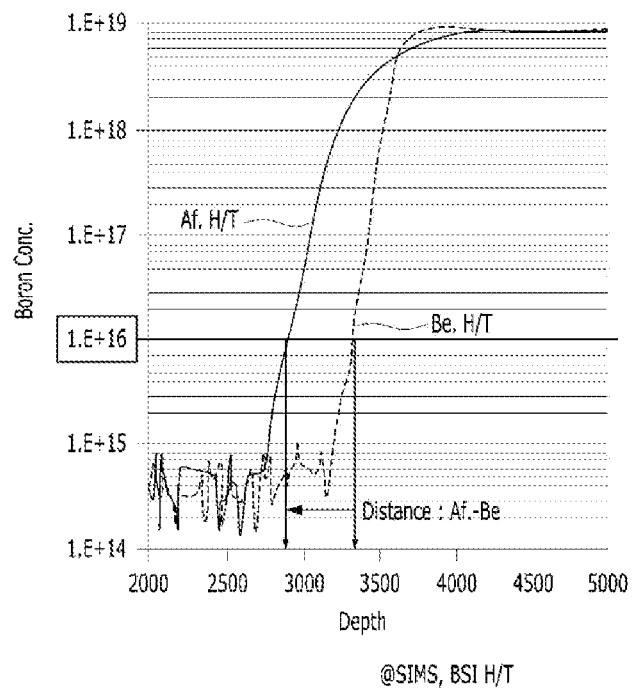
FIG. 3 illustrates the diffusion distance of boron before and after heat treatment.

FIG. 3 illustrates the diffusion distance of boron before and after heat treatment. Here, the heat treatment refers to a process that includes supplying hydrogen ($H_2$) gas to a substrate, followed by baking. Substantially, dry etching using hydrochloric acid (HCl) gas and deposition of an epitaxial layer may be performed. The baking is a process of removing native oxide on the substrate, and the etching is a process for controlling defects of the substrate or activating the surface thereof.

As can be seen from FIG. 3, the concentration of boron after heat treatment (Af. H/T) is greater than the concentration of boron before heat treatment (Be. H/T) at the same depth in the epitaxial layer, and the reason therefor is that the diffusion of boron is more active at high temperature as described above.

In addition, when the epitaxial layer is grown under different conditions with respect to the first and second specimens, one condition is changed while the other conditions are fixed, so that the effect of the one condition on the diffusion of boron can be determined.

First, the heat treatment time, the growth temperature and growth time of the epitaxial layer, and the etching time of the wafer of the first specimen may be the same as those of the second specimen, whereas the heat treatment temperature of the first specimen may be different from that of the second specimen. Specifically, the heat treatment temperature of the first specimen may be set to be higher than the heat treatment temperature of the second specimen.

As the heat treatment temperature increases, all nuclei having a small size in the wafer can be removed, so the critical size of nuclei for growth into BMD later may increase. Accordingly, as the heat treatment temperature increases, the number or density of BMDs after heat treatment may decrease, the number or density of BMDs may decrease, the diffusion potential of boron may also decrease, and thus the density of boron may decrease.

Figure 4A:
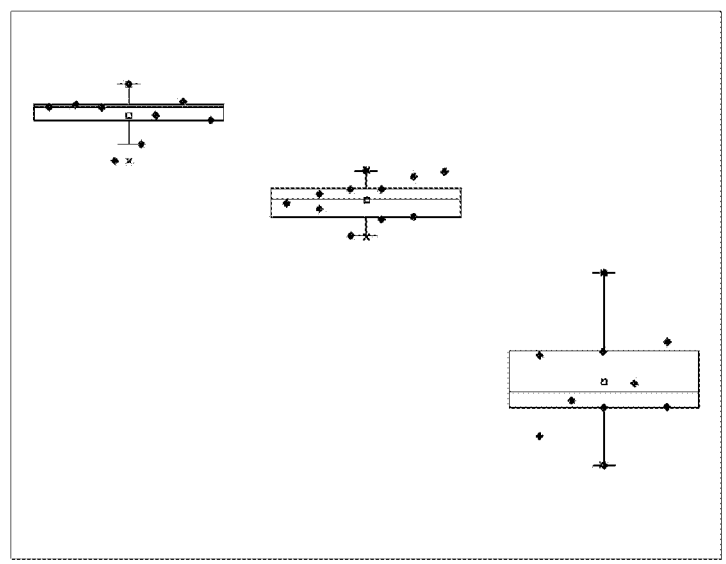
FIGS. 4A to 4C illustrate the changes in the number of BMDs and the diffusion distance of boron depending on the change of heat treatment temperature.
Figure 4B:
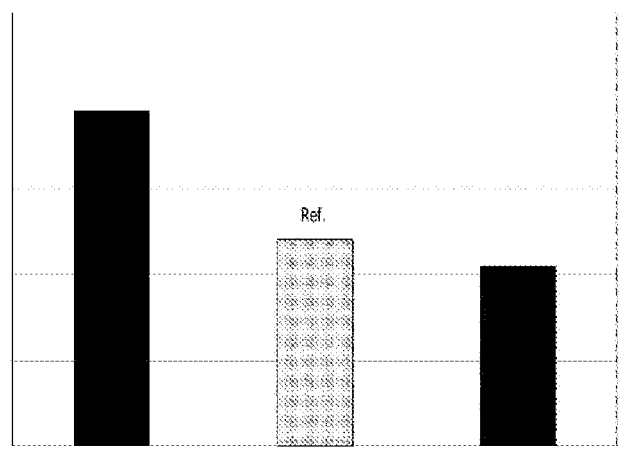
Figure 4C:
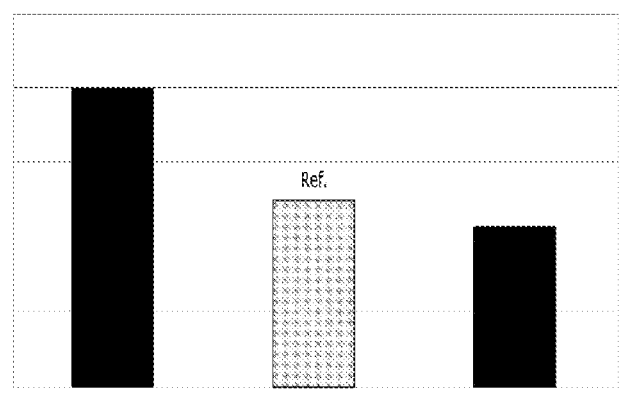

FIGS. 4A to 4C illustrate changes in the number of BMDs and the diffusion distance of boron depending on the change of heat treatment temperature.

The horizontal axis in each graph represents the heat treatment temperature, the vertical axis in FIG. 4A represents the density of BMD, the vertical axis in FIG. 4B represents the diffusion distance of boron, and the vertical axis in FIG. 4C axis represents the normalized diffusion distance of boron.

It can be seen from FIGS. 4A to 4C that, as the heat treatment temperature increases, the concentration of BMD decreases and the diffusion distance of boron also decreases.

In addition, the heat treatment temperature of the first specimen is set to be at most 10° C. higher than the heat treatment temperature of the second specimen in order to clearly detect the difference in the diffusion distance of boron and not to change other characteristics of the epitaxial layers of the first and second specimens.

In another embodiment, the heat treatment temperature, the growth temperature and growth time of the epitaxial layer, and the etching time of the wafer of the first specimen may be the same as those of the second specimen, and the heat treatment time of the first specimen may be different from that of the second specimen. More specifically, the heat treatment time of the first specimen may be set to be shorter than the heat treatment temperature of the second specimen.

Figure 5:
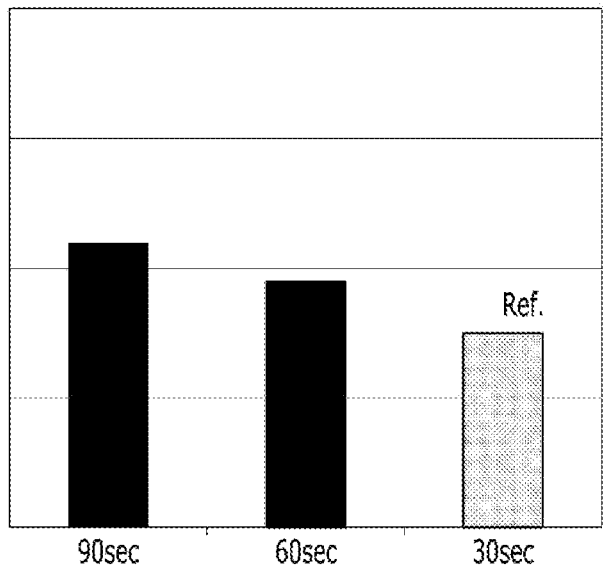
FIG. 5 illustrates the change in the diffusion distance of boron depending on the change of heat treatment temperature.

FIG. 5 illustrates the change in the diffusion distance of boron depending on the change of the heat treatment time. In FIG. 5, the horizontal axis represents the heat treatment time and the vertical axis represents the normalized diffusion distance of boron. It can be seen from FIG. 5 that, as the heat treatment time increases, the diffusion distance of boron increases. It can be seen from FIGS. 4A to 4C that, as the heat treatment temperature increases, the number or density of BMDs decreases and thus the diffusion distance of boron also decreases. However, it can be seen from FIG. 5 that, as the heat treatment time increases, the diffusion distance of boron decreases. Based thereon, it can be seen that the number or density of BMDs does not decrease even if the heat treatment time increases.

Figure 6:
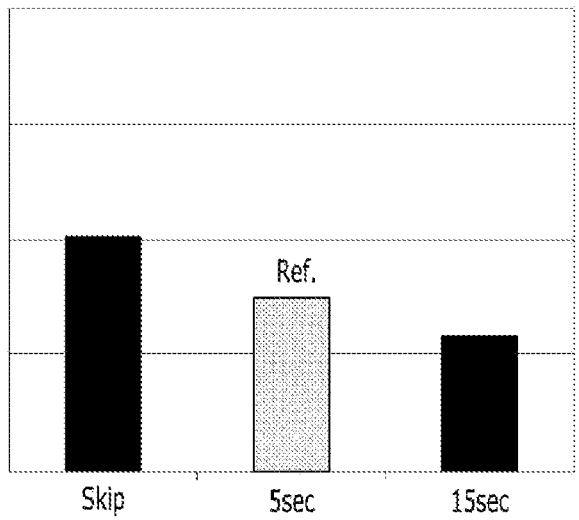
FIG. 6 illustrates the change in the diffusion distance of boron depending on the change of etching time.

In this regard, as can be seen from the example described with reference to FIG. 6, as the heat treatment time decreases, the inclination of the subsequently grown epitaxial layer becomes great, thus inhibiting boron diffusion during heat treatment.

In addition, the heat treatment time of the first specimen is set to be at most 30 seconds longer than the heat treatment time of the second specimen in order to clearly detect the difference in the diffusion distance of boron and not to change other characteristics of the epitaxial layers of the first and second specimens.

In another embodiment, the heat treatment temperature and heat treatment time, and the growth temperature and growth time of the epitaxial layer of the first specimen may be the same as those of the second specimen, and the etching time of the first specimen may be different from that of the second specimen. Specifically, the etching time of the first specimen may be set to be shorter than the etching time of the second specimen.

The etching was performed using hydrochloric acid (HCl) to a thickness of about 50 nanometers (nm). FIG. 6 illustrates a change in the diffusion distance of boron depending on the change of etching time, the horizontal axis represents the etching time and the vertical axis represents the normalized diffusion distance of boron. It can be seen from FIG. 6 that the diffusion distance of boron decreases as the etching time increases.

Figure 7A:
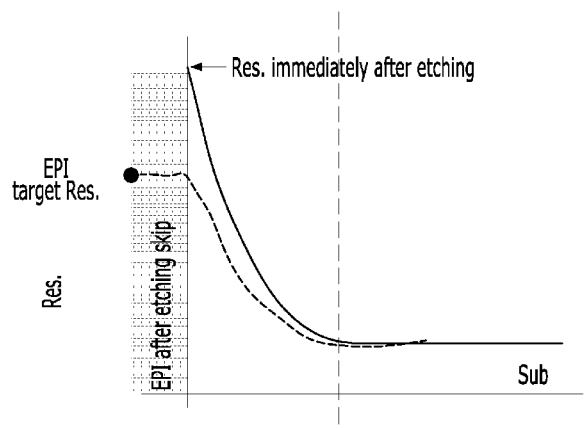
FIGS. 7A and 7B illustrate the epitaxial layer profile and boron diffusion after epitaxial layer growth and after epitaxial layer etching.
Figure 7B:
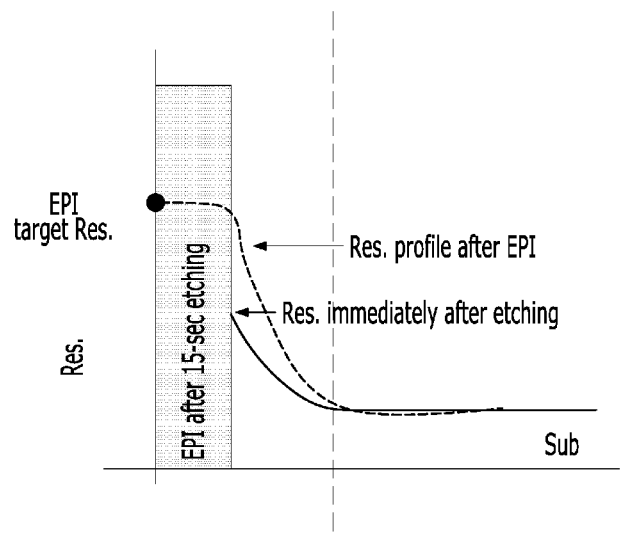

FIGS. 7A and 7B illustrate the epitaxial layer profile and boron diffusion after growth of the epitaxial layer and after etching of the epitaxial layer. As can be seen from FIGS. 7A and 7B, there is a difference between the profile of the residual epitaxial layer after etching (res. profile) and the profile of the residual epitaxial layer after growth of the epitaxial layer. Therefore, the difference in the residual epitaxial layer profile indicates the distance at which boron is diffused during heat treatment. In other words, as the etching time decreases, the inclination of the subsequently grown epitaxial layer becomes great, thus inhibiting boron diffusion during heat treatment.

In addition, the etching time of the first specimen is set to be at most 5 seconds shorter than the etching time of the second specimen in order to clearly detect the difference in the diffusion distance of boron and not to change other characteristics of the epitaxial layers of the first and second specimens.

In addition, whether or not the diffusion distance of boron was changed depending on the change of the growth temperature of the epitaxial layer was determined.

Figure 8:
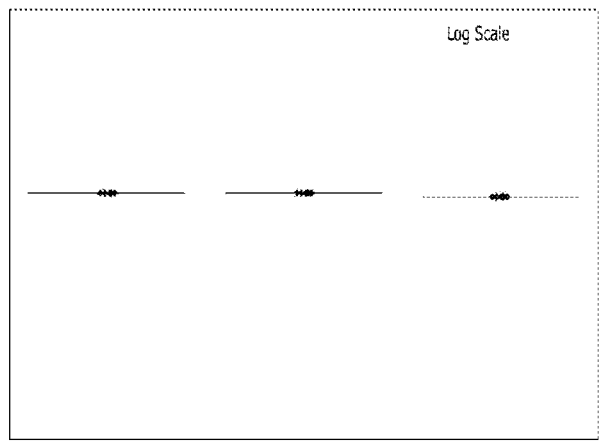
FIG. 8 illustrates the change in the BMD density depending on the change of growth temperature of the epitaxial layer.
Figure 9A:
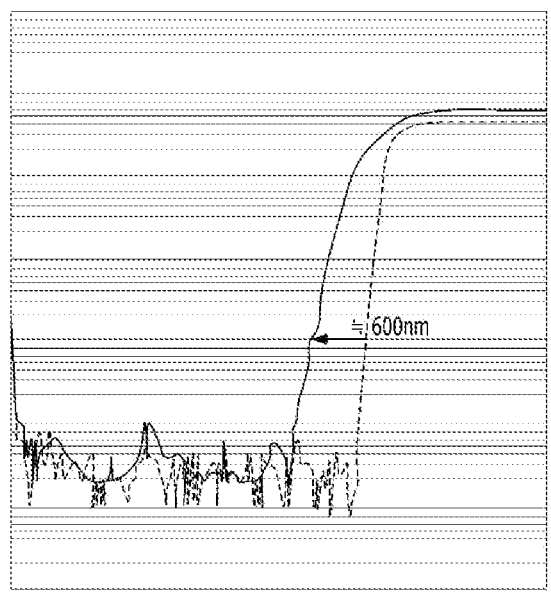
FIGS. 9A to 9C illustrate a diffusion distance of boron depending on the change of the growth temperature of the epitaxial layer.
Figure 9B:
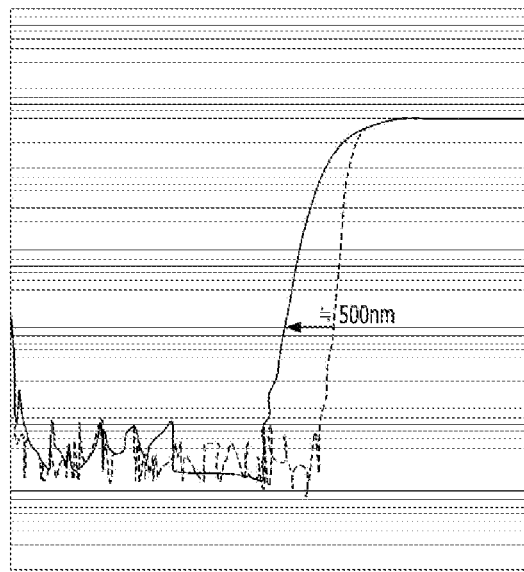
Figure 9C:
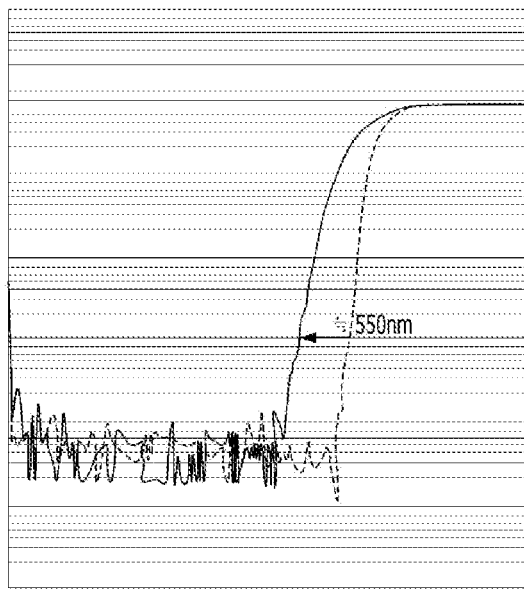

FIG. 8 illustrates the change in BMD density depending on the change in the growth temperature of the epitaxial layer, and FIGS. 9A to 9C illustrate the diffusion distance of boron depending on the growth temperature of the epitaxial layer.

As shown in FIG. 8, even if the growth temperature of the epitaxial layer is changed, there is no difference in the number or density of BMDs. As shown in FIGS. 9A to 9C, even if the growth temperature of the epitaxial layer is changed, the change degree of diffusion distance of boron was similar.

It can be seen from the embodiments described above that factors affecting the thickness of the residual epitaxial layer during heat treatment are the heat treatment temperature, heat treatment time, and etching time and more specifically, as the heat treatment temperature increases, the heat treatment time decreases, the etching time decreases, the diffusion of boron increases, and thus the density of boron in the epitaxial layer increases.

It will be apparent to those skilled in the art that various modifications and variations can be made in the present invention without departing from the spirit or scope of the invention.

Thus, it is intended that the present invention cover the modifications and variations of this invention provided they come within the scope of the appended claims and their equivalents.

INDUSTRIAL APPLICABILITY

The method for evaluating an epitaxial wafer according to the embodiment may be used in a process of manufacturing a device such as a semiconductor to maintain a uniform thickness of the epitaxial layer.

The invention claimed is:

1. A method of evaluating a wafer, the method comprising:
   cutting a wafer into a first specimen and a second specimen;
   growing and heat-treating epitaxial layers of the first specimen and the second specimen under different conditions; and
   measuring a diffusion distance of a dopant in each of the epitaxial layers of the first specimen and the second specimen,
   wherein a heat treatment time, a growth temperature and a growth time of the epitaxial layer, and an etching time of the wafer of the first specimen are the same as those of the second specimen, whereas a heat treatment temperature of the first specimen is higher than that of the second specimen.

2. The method according to claim 1, wherein the measuring of the diffusion distance of the dopant is performed using at least one of secondary ion mass spectrometry (SIMS), a laser microscope, an atomic force microscope (AFM), and spreading resistance probing (SRP).

3. A method of evaluating a wafer, the method comprising:
   cutting a wafer into a first specimen and a second specimen;
   growing and heat-treating epitaxial layers of the first specimen and the second specimen under different conditions; and
   measuring a diffusion distance of a dopant in each of the epitaxial layers of the first specimen and the second specimen,
   wherein the heat treatment temperature of the first specimen is at most 10° C. higher than the heat treatment temperature of the second specimen.

4. A method of evaluating a wafer, the method comprising:

cutting a wafer into a first specimen and a second specimen;
growing and heat-treating epitaxial layers of the first specimen and the second specimen under different conditions; and
measuring a diffusion distance of a dopant in each of the epitaxial layers of the first specimen and the second specimen,
wherein a heat treatment temperature, a growth temperature and a growth time of the epitaxial layer, and an etching time of the wafer of the first specimen are the same as those of the second specimen, whereas a heat treatment time of the first specimen is shorter than that of the second specimen.

5. The method according to claim 4, wherein the heat treatment time of the first specimen is at most 30 seconds shorter than that of the second specimen.

6. A method of evaluating a wafer, the method comprising:
cutting a wafer into a first specimen and a second specimen;
growing and heat-treating epitaxial layers of the first specimen and the second specimen under different conditions; and
measuring a diffusion distance of a dopant in each of the epitaxial layers of the first specimen and the second specimen,
wherein a heat treatment temperature, a heat treatment time, and a growth temperature and a growth time of the epitaxial layer of the first specimen are the same as those of the second specimen, whereas an etching time of the first specimen is shorter than that of the second specimen.

7. The method according to claim 6, wherein the etching time of the first specimen is at most 5 seconds shorter than that of the second specimen.

* * * * *